(12) United States Patent
Choi et al.

(10) Patent No.: US 11,978,696 B2
(45) Date of Patent: May 7, 2024

(54) SEMICONDUCTOR PACKAGE DEVICE

(71) Applicant: Samsung Electronics Co., Ltd., Suwon-si (KR)

(72) Inventors: Gyujin Choi, Asan-si (KR); Jae-Ean Lee, Suwon-si (KR); Changeun Joo, Cheonan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 180 days.

(21) Appl. No.: 17/568,465

(22) Filed: Jan. 4, 2022

(65) Prior Publication Data

US 2022/0384324 A1    Dec. 1, 2022

(30) Foreign Application Priority Data

May 31, 2021    (KR) .................. 10-2021-0069900

(51) Int. Cl.
| | |
|---|---|
| *H01L 23/498* | (2006.01) |
| *H01L 23/00* | (2006.01) |
| *H01L 23/31* | (2006.01) |
| *H01L 25/10* | (2006.01) |

(52) U.S. Cl.
CPC .... *H01L 23/49822* (2013.01); *H01L 23/3128* (2013.01); *H01L 23/49811* (2013.01); *H01L 23/49816* (2013.01); *H01L 24/06* (2013.01); *H01L 24/08* (2013.01); *H01L 25/105* (2013.01); *H01L 2224/0603* (2013.01); *H01L 2224/08235* (2013.01)

(58) Field of Classification Search
CPC .......... H01L 23/49822; H01L 23/3128; H01L 23/49811; H01L 23/49816
See application file for complete search history.

(56) References Cited

U.S. PATENT DOCUMENTS

| | | | |
|---|---|---|---|
| 10,154,599 B2 * | 12/2018 | Hu ..................... | H01L 21/6835 |
| 10,580,728 B2 | 3/2020 | Kim et al. | |
| 10,872,864 B2 * | 12/2020 | Wang .................... | H01L 21/56 |
| 10,943,869 B2 | 3/2021 | Zhai et al. | |
| 10,950,578 B2 | 3/2021 | Lee et al. | |
| 2008/0272488 A1 | 11/2008 | Miyata et al. | |
| 2017/0228529 A1 * | 8/2017 | Huang ............... | H01L 23/3114 |
| 2017/0323853 A1 * | 11/2017 | Hu ...................... | H01L 23/5383 |
| 2019/0006283 A1 * | 1/2019 | Wang ................. | H01L 23/5386 |
| 2019/0067249 A1 * | 2/2019 | Huang ................. | H01L 25/50 |

(Continued)

FOREIGN PATENT DOCUMENTS

KR    102098593 B1    4/2020

*Primary Examiner* — Nathan W Ha
(74) *Attorney, Agent, or Firm* — Muir Patent Law, PLLC

(57) ABSTRACT

Disclosed is a semiconductor package device comprising a semiconductor chip including first and second chip pads on an active surface of the semiconductor chip, and a redistribution substrate on the first and second chip pads. The redistribution substrate includes first and second redistribution patterns sequentially stacked on the active surface. The first redistribution pattern includes a first via part and a first via pad part vertically overlapping the first via part. The second redistribution pattern includes a second via part and a second via pad part vertically overlapping the second via part. The first via part contacts the first chip pad. The second via part contacts the second chip pad. A length of the second via part is greater than that of the first via part.

20 Claims, 17 Drawing Sheets

(56) References Cited

U.S. PATENT DOCUMENTS

| | | | |
|---|---|---|---|
| 2019/0103379 A1* | 4/2019 | Yu | H01L 23/49811 |
| 2019/0148267 A1* | 5/2019 | Chen | H01L 23/5389 |
| | | | 257/737 |
| 2019/0148301 A1* | 5/2019 | Huang | H01L 23/5385 |
| | | | 257/774 |
| 2019/0206783 A1* | 7/2019 | Kim | H01L 23/49827 |
| 2020/0243443 A1* | 7/2020 | Kuwabara | H01L 23/3107 |
| 2020/0279804 A1* | 9/2020 | Huang | H01L 23/5226 |
| 2021/0159193 A1* | 5/2021 | Huang | H01L 21/486 |
| 2022/0020674 A1* | 1/2022 | Huang | H01L 23/49822 |
| 2022/0122919 A1* | 4/2022 | Liu | H01L 23/5383 |
| 2022/0139725 A1* | 5/2022 | Chen | H01L 24/19 |
| | | | 257/774 |
| 2022/0139816 A1* | 5/2022 | Liao | H01L 23/5385 |
| | | | 257/737 |
| 2022/0157702 A1* | 5/2022 | Choi | H01L 23/49838 |
| 2023/0075602 A1* | 3/2023 | Huang | H01L 21/6835 |

* cited by examiner

SEMICONDUCTOR PACKAGE DEVICE

CROSS-REFERENCE TO RELATED APPLICATION

This U.S. nonprovisional application claims priority under 35 U.S.C § 119 to Korean Patent Application No. 10-2021-0069900 filed on May 31, 2021 in the Korean Intellectual Property Office, the disclosure of which is hereby incorporated by reference in its entirety.

BACKGROUND

The present inventive concepts relate to a semiconductor package device.

A semiconductor package is provided to implement an integrated circuit chip to qualify for use in electronic products. Typically, the semiconductor package is configured that a semiconductor chip is mounted on a printed circuit board (PCB) and bonding wires or bumps are used to electrically connect the semiconductor chip to the printed circuit board. With the development of electronic industry, various studies have been conducted to improve reliability and durability of semiconductor packages.

SUMMARY

Some embodiments of the present inventive concepts provide a semiconductor package device with increased reliability.

The object of the present inventive concepts is not limited to the mentioned above, and other objects which have not been mentioned above will be clearly understood to those skilled in the art from the following description.

According to some embodiments of the present inventive concepts, a semiconductor package device may comprise: a semiconductor chip that includes a first chip pad and a second chip pad, the first chip pad and the second chip pad being on an active surface of the semiconductor chip; and a redistribution substrate on the first chip pad and the second chip pad. The redistribution substrate may include a first redistribution pattern and a second redistribution pattern that are sequentially stacked on the active surface. The first redistribution pattern may include: a first via part; and a first via pad part that vertically overlaps the first via part. The second redistribution pattern may include: a second via part; and a second via pad part that vertically overlaps the second via part. The first via part may be in contact with the first chip pad. The second via part may be in contact with the second chip pad. A length of the second via part may be greater than a length of the first via part.

According to some embodiments of the present inventive concepts, a semiconductor package device may comprise: a semiconductor chip that includes a first chip pad and a second chip pad, the first chip pad and the second chip pad being on an active surface of the semiconductor chip; and a redistribution substrate on the first chip pad and the second chip pad. The redistribution substrate may include a first dielectric layer, a first redistribution pattern, a second dielectric layer, and a second redistribution pattern that are sequentially stacked on the active surface. The first redistribution pattern may be in contact with the first chip pad. The second redistribution pattern may include a first sub-redistribution pattern and a second sub-redistribution pattern. The first sub-redistribution pattern may include a first via part in contact with the second chip pad. The second sub-redistribution pattern may include a second via part in contact with the first redistribution pattern. A length of the first via part may be greater than a length of the second via part.

According to some embodiments of the present inventive concepts, a semiconductor package device may comprise: a first semiconductor package; and a second semiconductor package on the first semiconductor package. The first semiconductor package may include: a redistribution substrate having a first surface and a second surface opposite each other; a semiconductor chip on the first surface of the redistribution substrate and including a plurality of chip pads that face toward the first surface of the redistribution substrate, the chip pads being on an active surface of the semiconductor chip; and a plurality of external connection terminals on the second surface of the redistribution substrate. The redistribution substrate may include a first redistribution pattern, a second redistribution pattern, and an under-bump pattern that are sequentially stacked on the active surface. The first redistribution pattern may include a first via part and a first via pad part that vertically overlaps the first via part. The second redistribution pattern may include a second via part and a second via pad part that vertically overlaps the second via part. The second via pad part may be farther than the first via pad part away from the active surface. An uppermost portion of the second via part may be closer to the active surface than an uppermost portion of the first via pad part.

DETAILED DESCRIPTION OF EMBODIMENTS

The following will now describe semiconductor package devices and methods of fabricating the same according to the present inventive concepts in conjunction with the accompanying drawings.

FIGS. 1 to 8 illustrate cross-sectional views showing a method of fabricating a semiconductor package according to some embodiments of the present inventive concepts.

Figure 1:
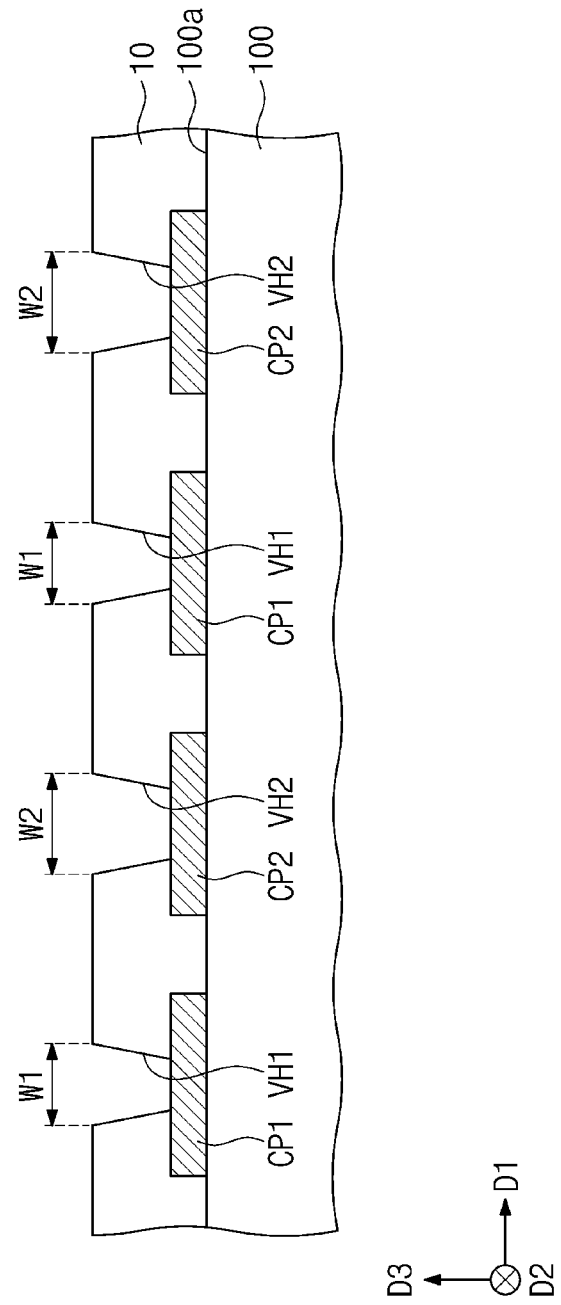
FIGS. 1 to 8 illustrate cross-sectional views showing a method of fabricating a semiconductor package according to some embodiments of the present inventive concepts.

Referring to FIG. 1, a semiconductor chip 100 may be provided which includes a plurality of chip pads CP1 and CP2. The chip pads CP1 and CP2 may include at least one first chip pad CP1 and at least one second chip pad CP2. The first and second chip pads CP1 and CP2 will be discussed below. The semiconductor chip 100 may have a surface 100a that is an active surface on which the first and second chip pads CP1 and CP2 are disposed. The active surface 100a may be a region where an integrated circuit is formed such as transistors. The active surface 100a may be a substantially flat surface.

Terms such as "same," "equal," "planar," "flat," or "coplanar," as used herein encompass identicality or near identicality including variations that may occur, for example, due to manufacturing processes. The term "substantially" may be used herein to emphasize this meaning, unless the context or other statements indicate otherwise.

The first and second chip pads CP1 and CP2 may be located to be spaced apart from each other along a first direction D1 parallel to the active surface 100a. In addition, the first and second chip pads CP1 and CP2 may be located to be spaced apart from each other along a second direction D2 that is parallel to the active surface 100a and intersects the first direction D1. For example, the first direction D1 may be perpendicular to the second direction D2.

A first dielectric layer 10 may be formed on the active surface 100a of the semiconductor chip 100. The first dielectric layer 10 may be formed by a coating process such as spin coating or slit coating, a photo-patterning process, and a curing process. The first dielectric layer 10 may be made of photo-imageable dielectric (PID). The first dielectric layer 10 may include or be formed of, for example, a photosensitive polymer. The photosensitive polymer may include or may be, for example, one or more of photosensitive polyimide, polybenzoxazole, phenolic polymers, and benzocyclobutene polymers.

The first dielectric layer 10 may undergo a photo-patterning process to form a first via hole VH1 that exposes the first chip pad CP1 of the semiconductor chip 100 and also to form a second via hole VH2 that exposes the second chip pad CP2 of the semiconductor chip 100. For example, the photo-patterning process may include an exposure process and a development process.

The first via hole VH1 may have a first width W1 along the first direction D1, and the first width W1 may be a maximum width along the first direction D1 of the first via hole VH1. The second via hole VH2 may have a second width W2 along the first direction D1, and the second width W2 may be a maximum width along the first direction D1 of the second via hole VH2. The second width W2 may be greater than the first width W1.

Figure 2:
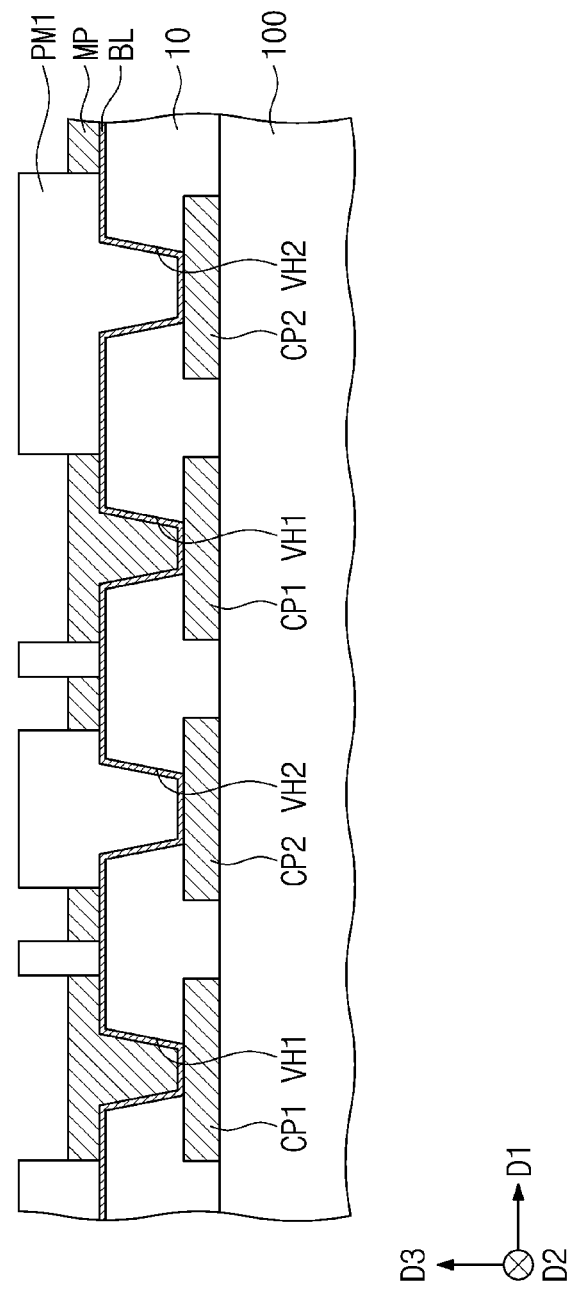

Referring to FIG. 2, a seed/barrier layer BL may be formed to cover top and lateral surfaces of the first dielectric layer 10 and to also cover top surfaces of the exposed first and second chip pads CP1 and CP2. The seed/barrier layer BL may include or be formed of a conductive material, such as copper (Cu)/titanium (Ti). The seed/barrier layer BL may be formed by using physical vapor deposition (PVD), chemical vapor deposition (CVD), or atomic layer deposition (ALD). A first photoresist pattern PM1 may be formed on the seed/barrier layer BL. The first photoresist pattern PM1 may define a location where a first redistribution pattern will be formed as discussed below. The first photoresist pattern PM1 may expose the first via hole VH1 and fill the second via hole VH2.

Afterwards, a metal pattern MP may be formed on the seed/barrier layer BL exposed by the first photoresist pattern PM1. The metal pattern MP may fill the first via hole VH1. The metal pattern MP may be formed by performing an electroplating process in which the seed/barrier layer BL is used as an electrode.

Figure 3:
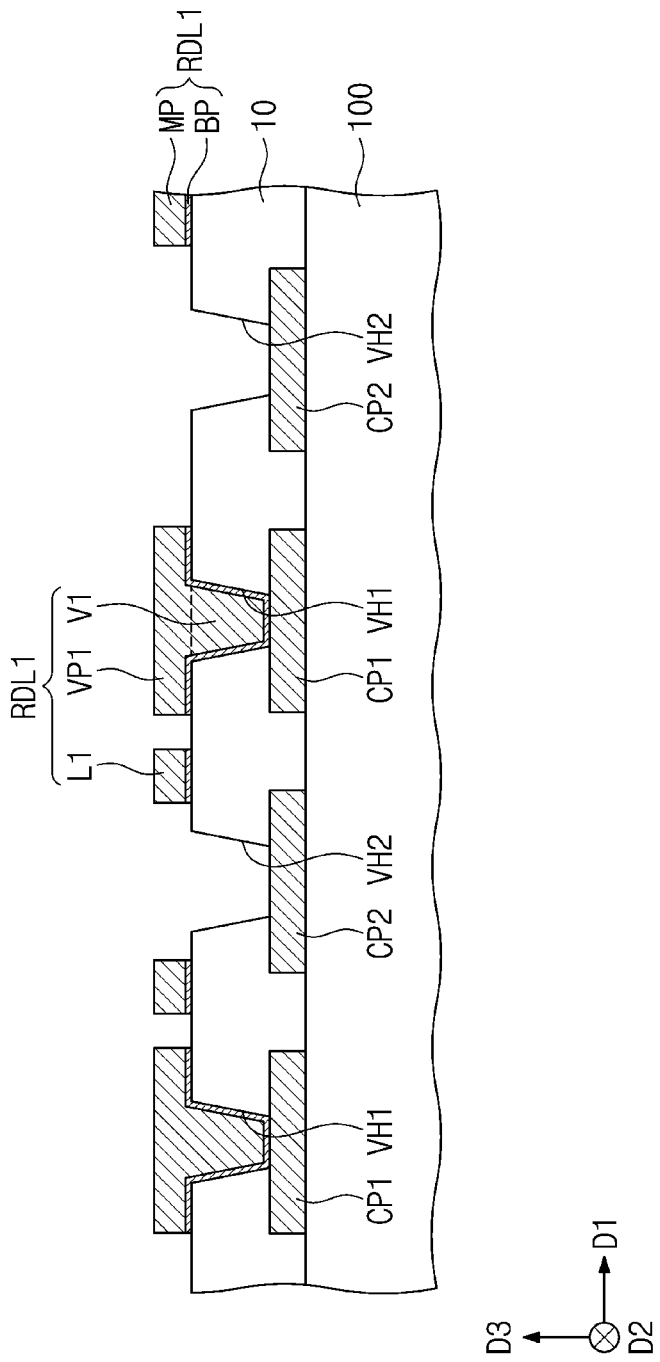

Referring to FIG. 3, the first photoresist pattern PM1 may be removed. After that, the seed/barrier layer BL may be etched to form a seed/barrier pattern BP. The seed/barrier pattern BP and the metal pattern MP may constitute a first redistribution pattern RDL1. The first dielectric layer 10 and the first redistribution pattern RDL1 may form a first redistribution layer. The second chip pad CP2 may be exposed by the removal of the first photoresist pattern PM1 and the etching of the seed/barrier layer BL.

The first redistribution pattern RDL1 may include a first via part V1, a first via pad part VP1, and a first line part L1. The first via part V1 may penetrate the first dielectric layer 10. The first via part V1 may be in contact with the first chip pad CP1. In this disclosure, the first chip pad CP1 may indicate a chip pad in contact with the first via part V1 of the first redistribution pattern RDL1. The first via pad part VP1 may be electrically connected to the first via part V1 and may be disposed on the first dielectric layer 10. For example, the first via pad part VP1 may be directly connected to the first via part V1. The first via pad part VP1 may vertically overlap the first via part V1. The first line part L1 may be electrically connected to the first via pad part VP1 and may extend in one or both of the first direction D1 and the second direction D2. For example, the first line part L1 may be directly connected to the first via pad part VP1. For example, the first via part V1, the first via pad part VP1 and the first line part L1 may be integrally formed as one body.

As used herein, components described as being "electrically connected" are configured such that an electrical signal can be transferred from one component to the other (although such electrical signal may be attenuated in strength as it transferred and may be selectively transferred).

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact.

Figure 4:
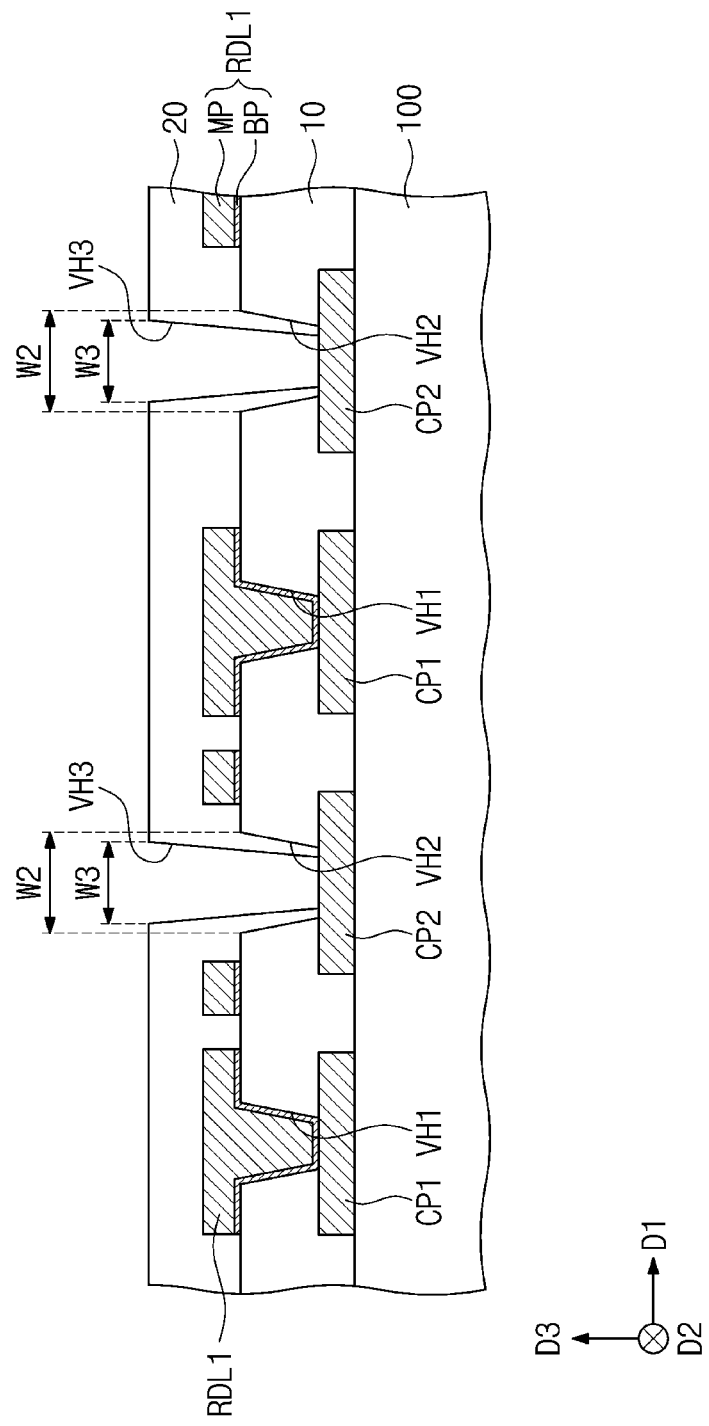

Referring to FIG. 4, a second dielectric layer 20 may be formed on the first redistribution pattern RDL1 and the first dielectric layer 10. The second dielectric layer 20 may include substantially the same material (e.g., the same material) as that of the first dielectric layer 10. Therefore, differently from that shown, no interface may be observed between the first dielectric layer 10 and the second dielectric layer 20 in certain embodiments.

Likewise the first dielectric layer 10, the second dielectric layer 20 may be formed by a coating process, a photo-patterning process, and a curing process. A photo-patterning process may be employed to form a third via hole VH3 that exposes the second chip pad CP2. The third via hole VH3 may have a third width W3 along the first direction D1. The third width W3 may be a maximum width along the first direction D1 of the third via hole VH3. The third width W3 may be less than the second width W2 of the second via hole VH2. Although not shown, the third via hole VH3 may be formed simultaneously with a via hole that exposes the first line part L1 of the first redistribution pattern RDL1.

Figure 5:
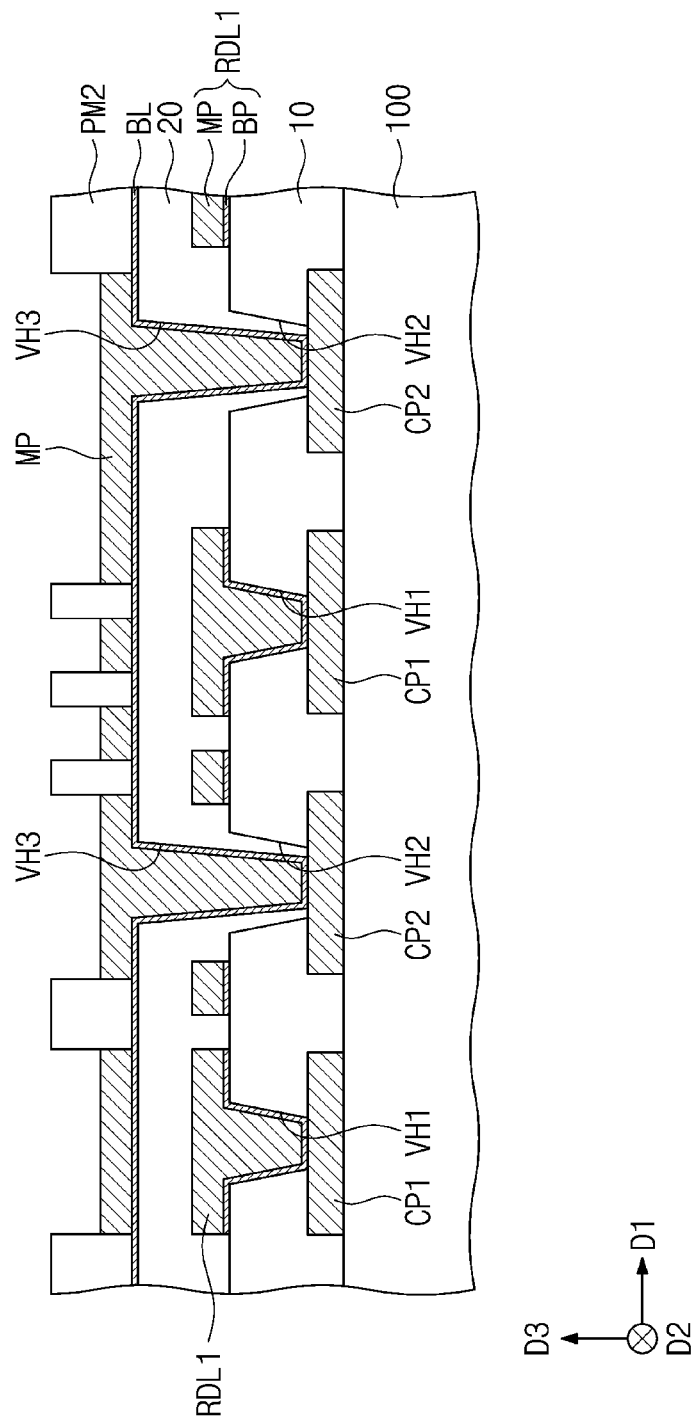

Referring to FIG. 5, a seed/barrier layer BL may be formed to cover top and lateral surfaces of the second dielectric layer 20 and also to cover the exposed second chip pads CP2. A second photoresist pattern PM2 may be formed on the seed/barrier layer BL. The second photoresist pattern PM2 may define a location where a second redistribution pattern will be formed as discussed below. Thereafter, a metal pattern MP may be formed on the seed/barrier layer BL exposed by the second photoresist pattern PM2. The metal pattern MP may fill the third via hole VH3.

Figure 6:
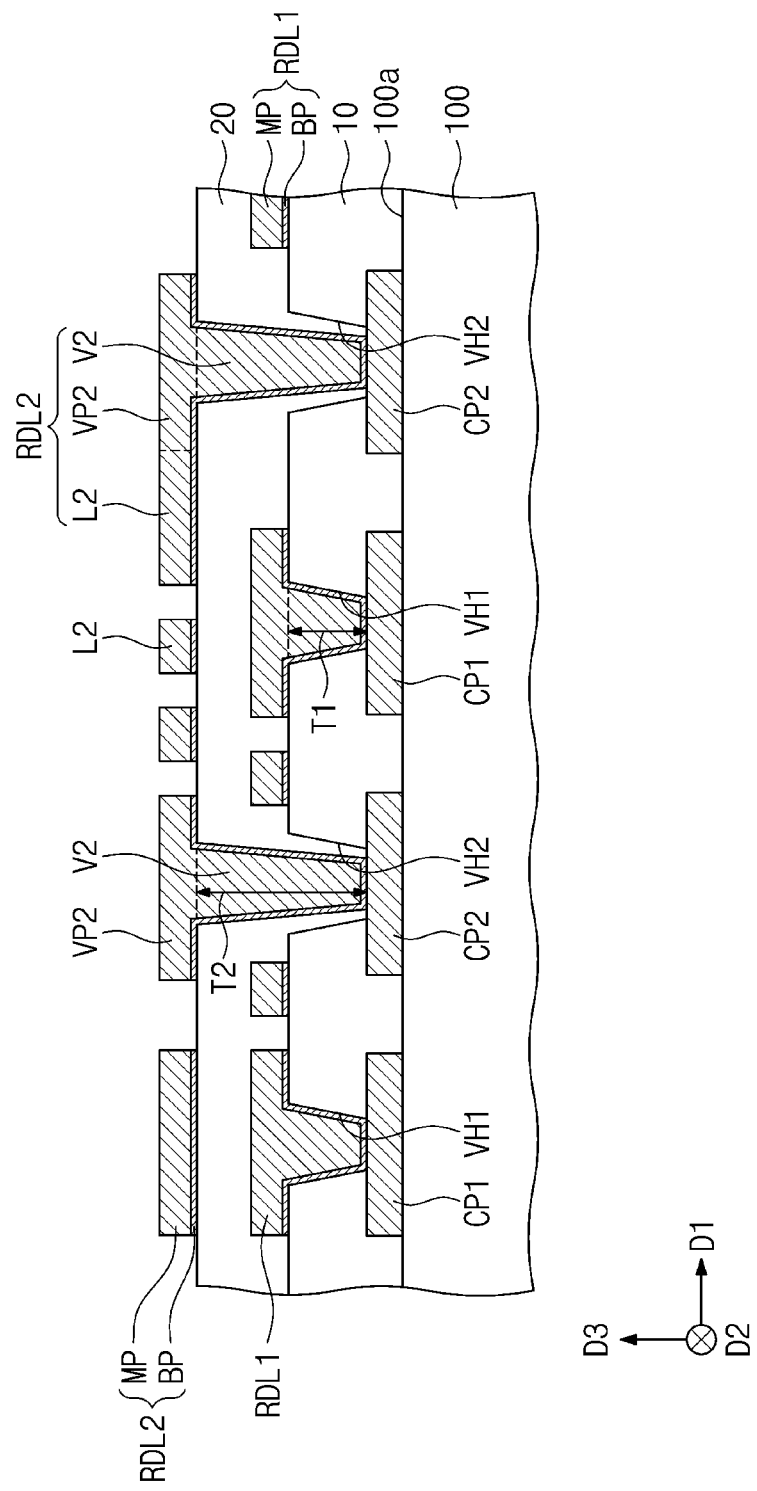

Referring to FIG. 6, the second photoresist pattern PM2 may be removed. After that, the seed/barrier layer BL may be etched to form a seed/barrier pattern BP. The seed/barrier pattern BP and the metal pattern MP may constitute a second redistribution pattern RDL2. The second dielectric layer 20 and the second redistribution pattern RDL2 may form a second redistribution layer.

The second redistribution pattern RDL2 may include a second via part V2, a second via pad part VP2, and a second line part L2. The second via part V2 may penetrate the first dielectric layer 10 and the second dielectric layer 20. The second via part V2 may be in contact with the second chip pad CP2. In this disclosure, the second chip pad CP2 may indicate a chip pad in contact with the second via part V2 of the second redistribution pattern RDL2. The second via pad part VP2 may be electrically connected to the second via part V2 and may be disposed on the second dielectric layer 20. For example, the second via pad part VP2 may be directly connected to the second via part V2. The second via pad part VP2 may vertically overlap the second via part V2. The second line part L2 may be electrically connected to the second via pad part VP2 and may extend in one or both of the first direction D1 and the second direction D2. For example, the second line part L2 may be directly connected to the second via pad part VP2. For example, the second via part V2, the second via pad part VP1 and the second line part L1 may be integrally formed as one body.

The first via part V1 may have a first length T1 along a third direction D3. In this disclosure, the term "length" may denote a distance in the third direction D3 perpendicular to the active surface 100a. The first length T1 may be the same as a distance between the top surface of the first chip pad CP1 and a bottom surface of the first via pad part VP1. The second via part V2 may have a second length T2 along the third direction D3. The second length T2 may be the same as a distance between the top surface of the second chip pad CP2 and a bottom surface of the second via pad part VP2. The second length T2 may be greater than the first length T1.

Figure 7:
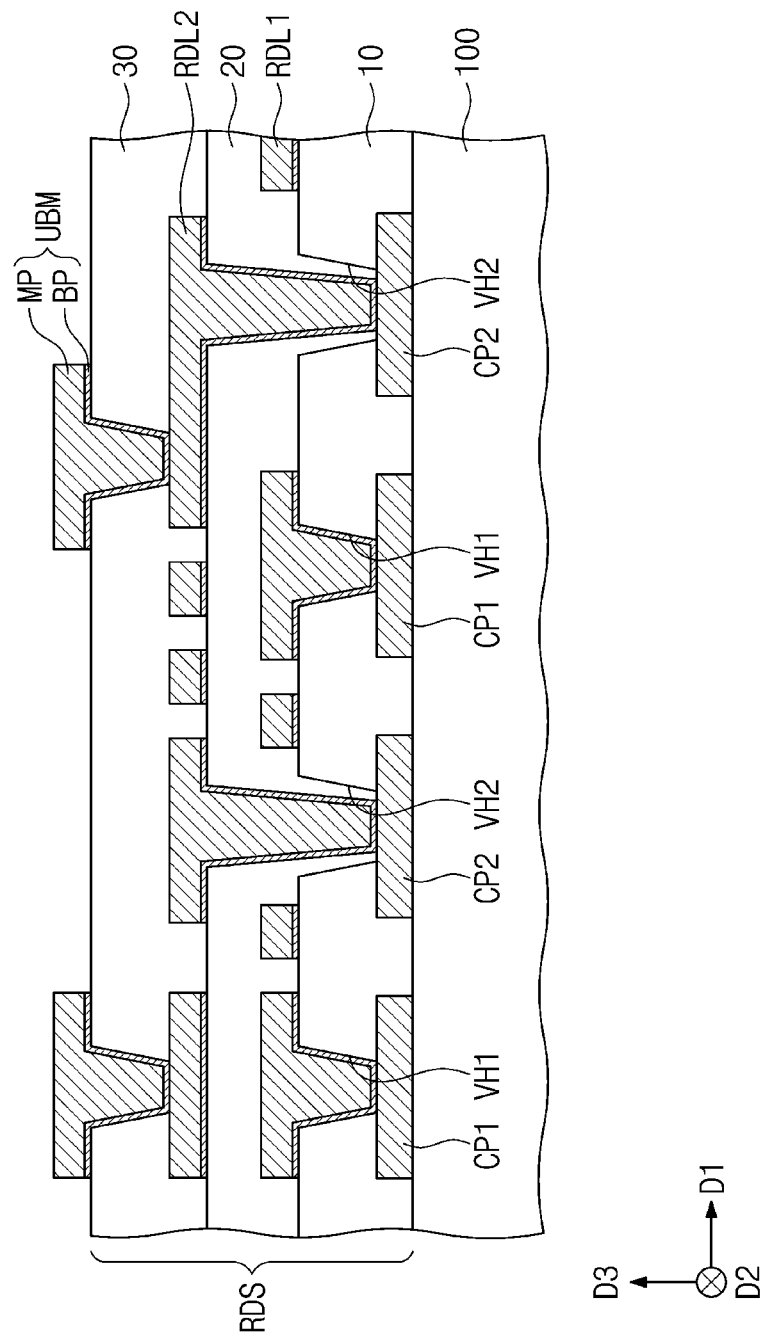

Referring to FIG. 7, a third dielectric layer 30 may be formed. The third dielectric layer 30 may be formed by a method the same as or similar to that used for forming one or both of the first dielectric layer 10 and the second dielectric layer 20. Afterwards, an under-bump pattern UBM may be formed by a method the same as or similar to that used for forming one or both of the first redistribution pattern RDL1 and the second redistribution pattern RDL2. According to some embodiments, the metal pattern MP of the under-bump pattern UBM may include or be formed of a plurality of stacked layers including metal (gold, nickel, etc.). The third dielectric layer 30 and the under-bump pattern UBM may constitute a third redistribution layer. As such, a redistribution substrate RDS may be formed which includes the first redistribution layer, the second redistribution layer, and the third redistribution layer.

Figure 8:
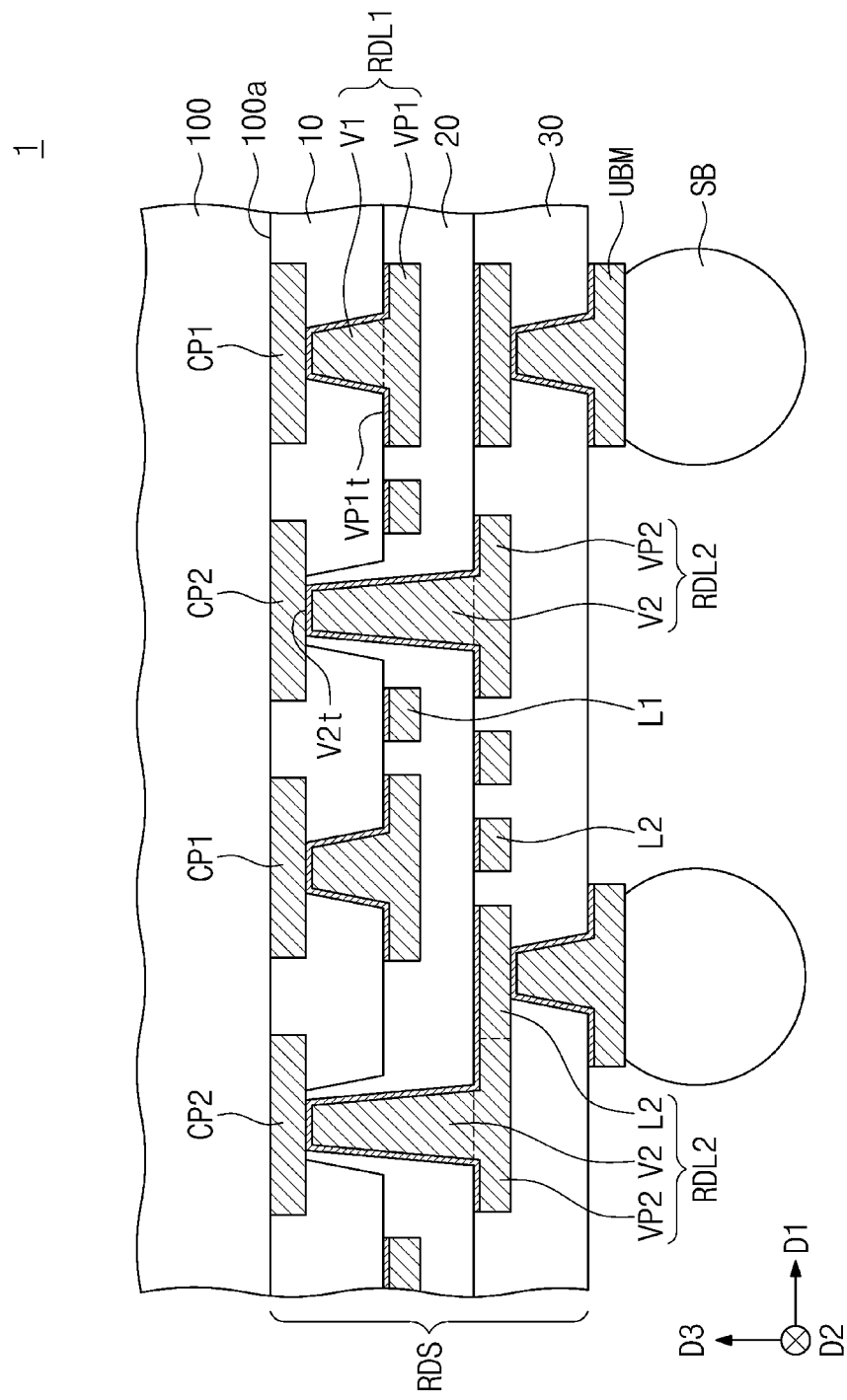

Referring to FIG. 8, an external connection terminal SB may be provided on the under-bump pattern UBM, and thus a semiconductor package 1 may be fabricated. The external connection terminal SB may be a connection terminal that contacts an external substrate such as a motherboard and electrically connects the semiconductor chip 100 to the external substrate through the under-bump pattern UBM, the first and second redistribution patterns RDL1 and RDL2, and the first and second chip pads CP1 and CP2.

The second via pad part VP2 may be disposed farther than the first via pad part VP1 away from the active surface 100a. An uppermost part V2t of the second via part V2 may be disposed closer to the active surface 100a than an uppermost part VP1t of the first via pad part VP1.

In a case where chip pads are arranged at high density, a spatial limitation may occur in forming redistribution lines connected to the chip pads. As an approach to solve the problem above, the redistribution lines may be formed to have their reduced line-widths or a stacked via structure may be formed in which second via parts of second redistribution patterns vertically overlap first via parts of first redistribution patterns. However, the line-width reduction process may require high accuracy, and the stacked via structure may need spaces for forming first via pad parts of the first redistribution patterns.

According to the present inventive concepts, the second redistribution pattern may include the second via part (or deep via part), and the second via part may not vertically overlap the first via part. For example, the second via part may be in contact with the chip pad without being in contact with the first via pad part. As a result, the first redistribution pattern may be formed to have no first via pad part directly connected to the second redistribution pattern. Thus, an area may be reduced as much as that of the first via pad part whose area is relatively larger than an area of a line part, and accordingly a contact area may be reduced between a metallic material and its surrounding dielectric material. In addition, the requirement of the line-width reduction process may be reduced to omit a fine patterning process needed for forming fine lines. As a result, it may be beneficial to achieve a semiconductor package with improved reliability.

Figure 9:
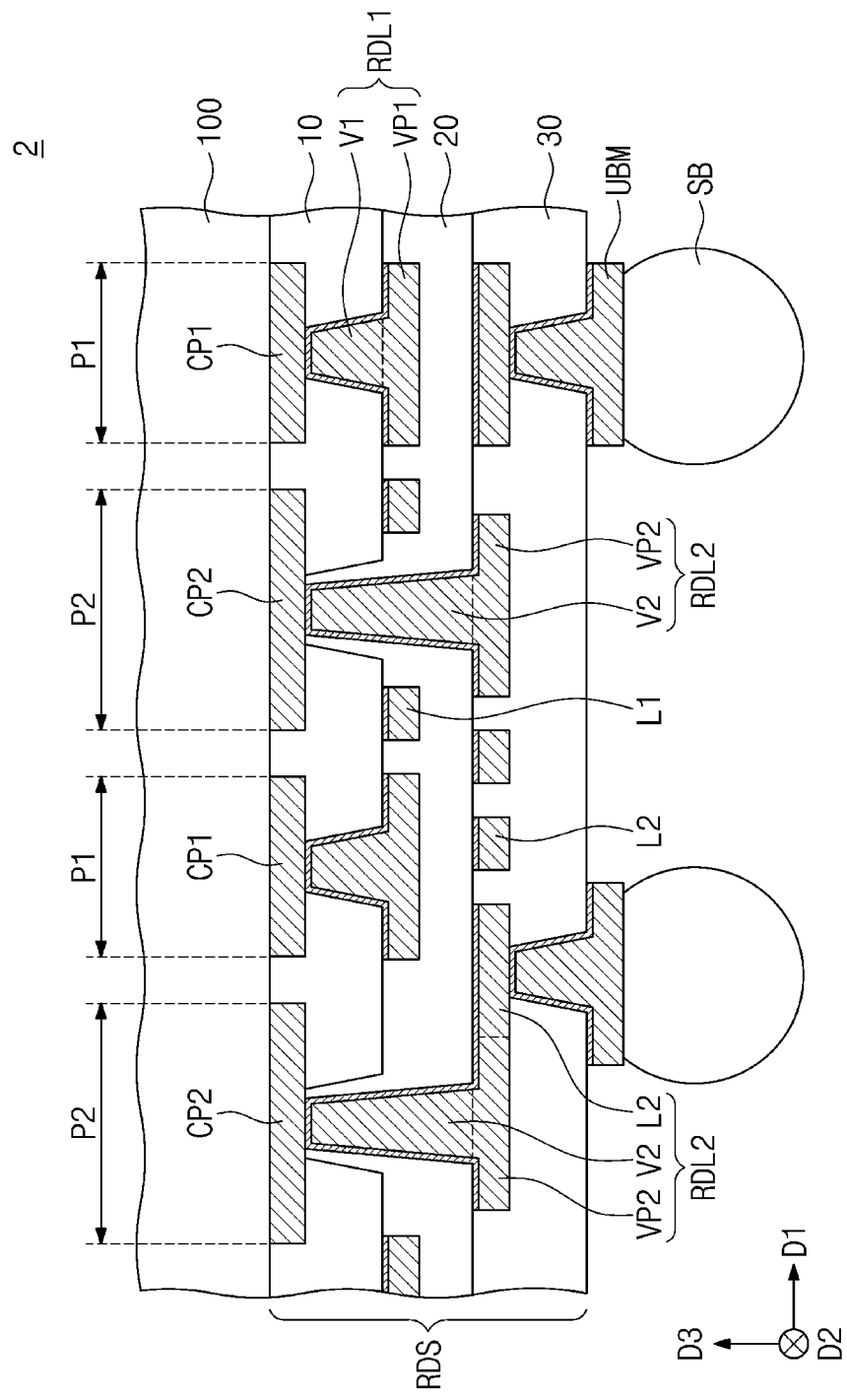
FIG. 9 illustrates a cross-sectional view showing a semiconductor package according to some embodiments of the present inventive concepts.

FIG. 9 shows a semiconductor package 2 according to some embodiments of the present inventive concepts. Referring to FIG. 9, a first chip pad CP1 and a second chip pad CP2 may be provided which have different diameters from each other. The first chip pad CP1 and the second chip pad CP2 may each have a circular shape in a plan view.

The first chip pad CP1 may have a first diameter P1 along the first direction D1. The second chip pad CP2 may have a second diameter P2 along the first direction D1. The second diameter P2 may be greater than the first diameter P1. The second diameter P2 may be about 1.1 times to about 1.9 times greater than the first diameter P1. The second diameter P2 may be about 5 μm to about 60 μm greater than the first diameter P1. For example, the first diameter P1 may range from about 60 μm to about 80 μm. As the second chip pad CP2 has a relatively large diameter, a second via hole VH2 may be locally formed on/within a top surface of the second chip pad CP2 even when forming the second via hole VH2 whose width W2 is large as discussed above in FIG. 1.

Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

Figure 10:
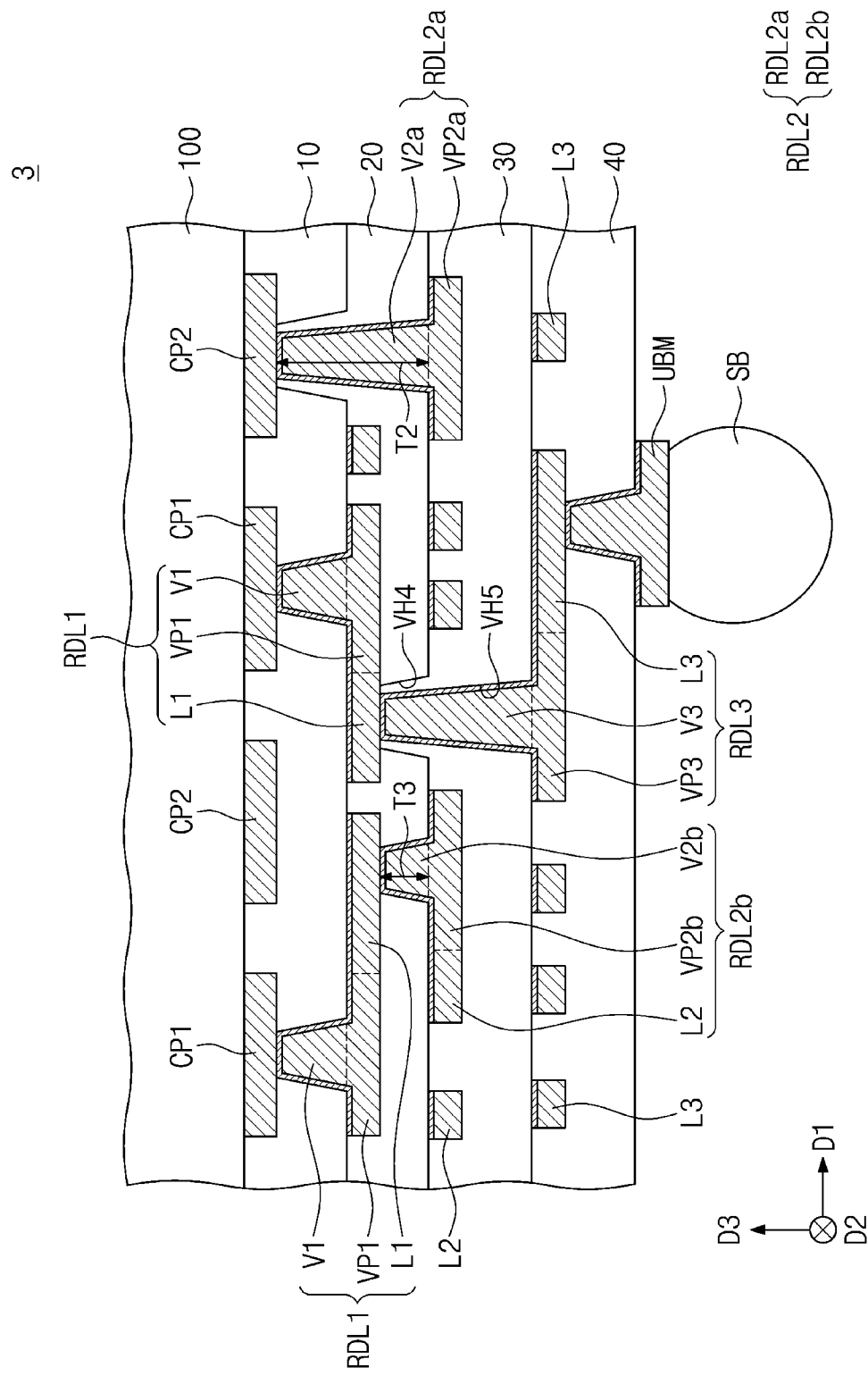
FIG. 10 illustrates a cross-sectional view showing a semiconductor package according to some embodiments of the present inventive concepts.

FIG. 10 shows a semiconductor package 3 according to some embodiments of the present inventive concepts. Referring to FIG. 10, a second dielectric layer 20 and a second redistribution pattern RDL2 may be provided. The second redistribution pattern RDL2 may include a first sub-redistribution pattern RDL2a and a second sub-redistribution pattern RDL2b. The first sub-redistribution pattern RDL2a may be the same or substantially the same as the second redistribution pattern RDL2 discussed above with respect to FIGS. 8 and 9. For example, the first sub-redistribution pattern RDL2a may include a via part V2a and a via pad part VP2a that are respectively the same or substantially the same as the second via part V2 and the second via pad part VP2 depicted in FIG. 8 or 9.

The second sub-redistribution pattern RDL2b may include a via part V2b, a via pad part VP2b, and a second line part L2. The via part V2b of the second sub-redistribution pattern RDL2b may have a length T3 less than a length T2 of the via part V2a of the first sub-redistribution pattern RDL2a. The second line part L2 of the first sub-redistribution pattern RDL2a may have a bottom surface at substantially the same as that of a bottom surface of the second line part L2 of the second subs-redistribution pattern RDL2b. For example, the bottom surface of the second line part L2 of the first sub-redistribution pattern RDL2a may be at a vertical level the same as a vertical level of a bottom surface of the second line part L2 of the second subs-redistribution pattern RDL2b. For example, vertical levels in this disclosure may be respective distances in the third direction with respect to a reference plane perpendicular to the third direction D3.

A third dielectric layer 30 and a third redistribution pattern RDL3 may be provided on the second redistribution pattern RDL2 and the second dielectric layer 20. The third redistribution pattern RDL3 may include a third via part V3, a third via pad part VP3, and a third line part L3. The third via part V3 may penetrate the third dielectric layer 30 and the second dielectric layer 20. The third via part V3 may be in contact with the first redistribution pattern RDL1. The second dielectric layer 20 may include a fourth via hole VH4 that exposes the first line part L1 of the first redistribution pattern RDL1. The third dielectric layer 30 may include a fifth via hole VH5 having a width in the first direction D1 less than a width of the fourth via hole VH4 in the first direction D1. The fifth via hole VH5 may be filled with the third via part V3 of the third redistribution pattern RDL3.

According to the present inventive concepts, the third redistribution pattern RDL3 may have the third via part V3 in contact with the first redistribution pattern RDL1 not through the second redistribution pattern RDL2. In addition, the second sub-redistribution pattern RDL2b may have the via part V2b in contact with the first line part L1 of the first redistribution pattern RDL1 and not in contact with the first via pad part VP1.

Figure 11:
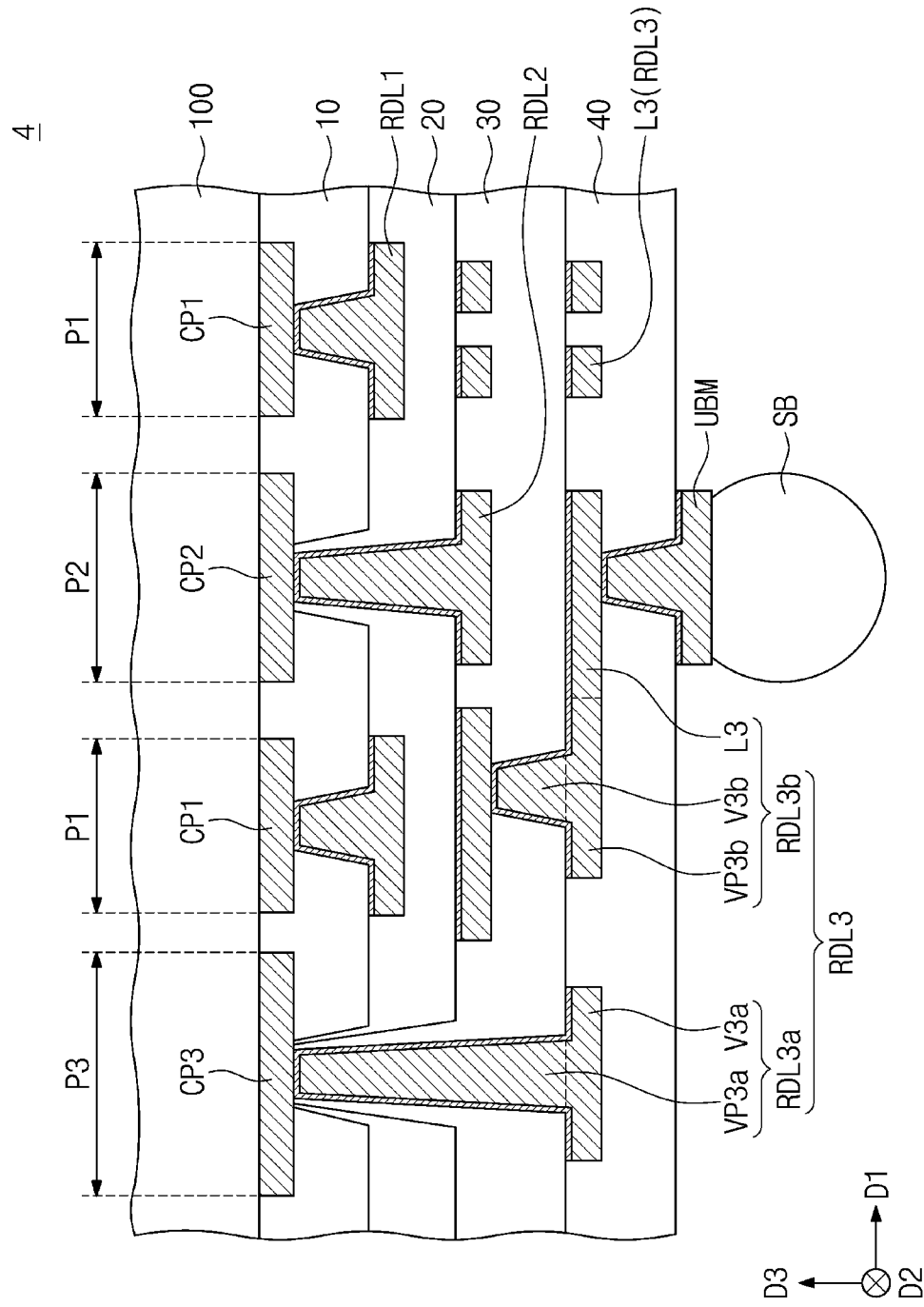
FIG. 11 illustrates a cross-sectional view showing a semiconductor package according to some embodiments of the present inventive concepts.

FIG. 11 shows a semiconductor package 4 according to some embodiments of the present inventive concepts. Referring to FIG. 11, the semiconductor chip 100 may further include a third chip pad CP3. The third chip pad CP3 may be a chip pad with which the third via part V3 of the third redistribution pattern RDL3 is in contact.

The third redistribution pattern RDL3 may include a third sub-redistribution pattern RDL3a and a fourth sub-redistribution pattern RDL3b. The third sub-redistribution pattern RDL3a may include a via part V3a that penetrates the first, second, and third dielectric layers 10, 20, and 30 and is contact with the third chip pad CP3. The third sub-redistribution pattern RDL3a may include a via pad part VP3a that vertically overlaps and is electrically connected to the via part V3a. For example, the via pad part VP3a and the via part V3a of the third sub-redistribution pattern RDL3a may be integrally formed to be one body. The fourth sub-redistribution pattern RDL3b may include a via part V3b that penetrates the third dielectric layer 30 and contacts the second redistribution pattern RDL2. The fourth sub-redistribution pattern RDL3b may include a via pad part VP3b that vertically overlaps and is electrically connected to the via part V3b. For example, the via pad part VP3b and the via part V3b of the fourth sub-redistribution pattern RDL3b may be integrally formed to be one body. The third sub-redistribution pattern RDL3a may include a third line part L3 electrically connected to the via pad part VP3a, and the fourth sub-redistribution pattern RDL3b may include a third line part L3 electrically connected to the via pad part VP3b. For example, the third line part L3 electrically connected to the via pad part VP3a may be integrally formed with the via pad part VP3a to be one body, and the third line part L3 electrically connected to the via pad part VP3b may be integrally formed with the via pad part VP3b to be one body. The third line part L3 electrically connected to the via pad part VP3a may be electrically insulated from the third line part L3 electrically connected to the via pad part VP3b. The under-bump pattern UBM may be in contact with the third line part L3.

Figure 12:
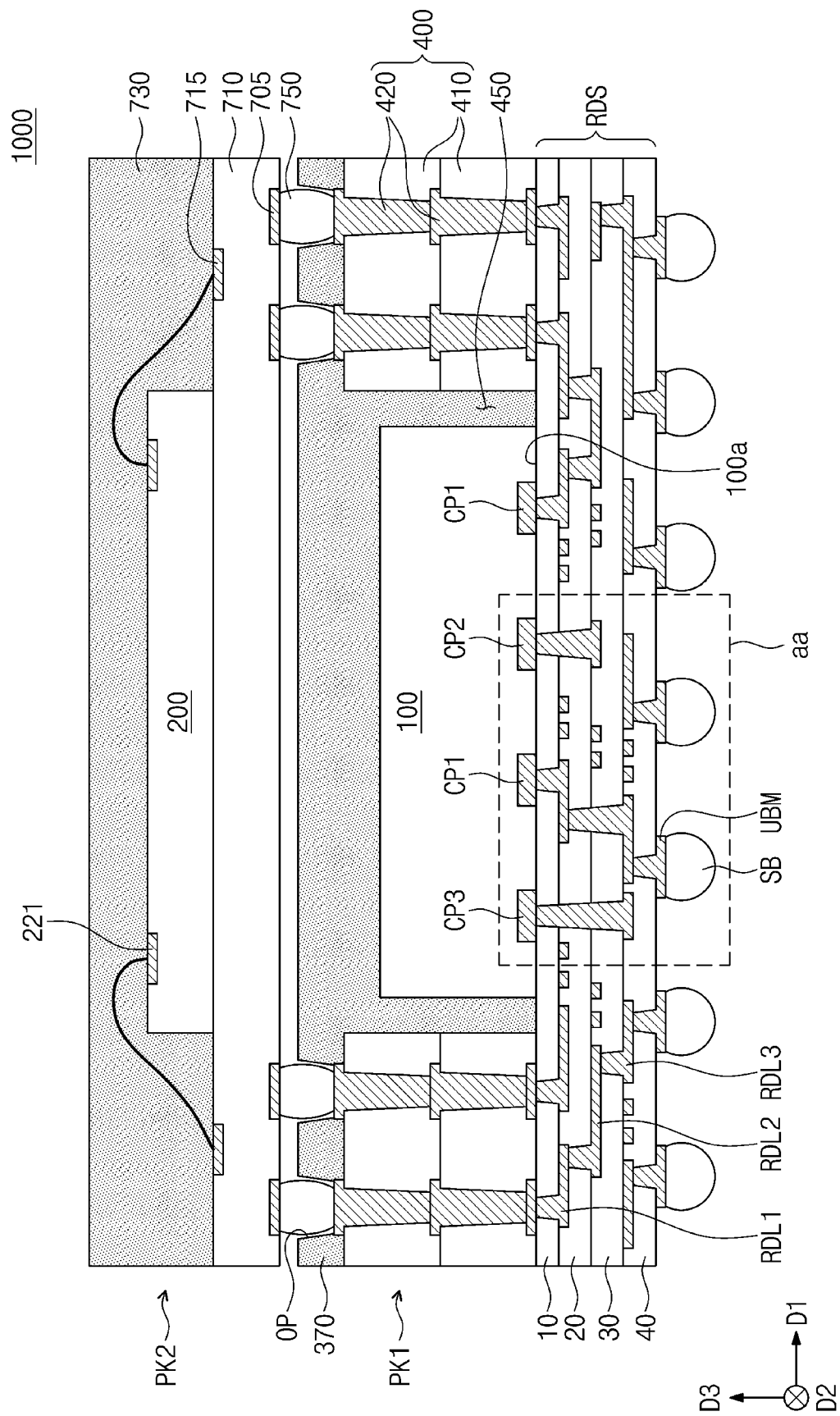
FIG. 12 illustrates a cross-sectional view showing a semiconductor package device according to some embodiments of the present inventive concepts.

FIG. 12 illustrates a cross-sectional view showing a semiconductor package device according to some embodiments of the present inventive concepts. Referring to FIG. 12, a semiconductor package device 1000 according to some embodiments may include a first semiconductor package PK1 and a second semiconductor package PK2 disposed on the first semiconductor package PK1.

The first semiconductor package PK1 may include a redistribution substrate RDS, a connection substrate 400 on the redistribution substrate RDS, a first semiconductor chip 100, and a lower molding layer 370. The redistribution substrate RDS and the first semiconductor chip 100 may be respectively substantially the same as the redistribution substrate RDS and the semiconductor chip 100 that are discussed in FIGS. 8 to 11. For example, the redistribution substrate RDS and the first semiconductor chip 100 may be respectively the same as the redistribution substrate RDS and the semiconductor chip 100 that are discussed in FIGS. 8 to 11.

Spatially relative terms, such as "beneath," "below," "lower," "above," "upper" and the like, may be used herein for ease of description to describe positional relationships. It will be understood that the spatially relative terms encompass different orientations of the device in addition to the orientation depicted in the figures.

For example, the redistribution substrate RDS may include first, second, third, and fourth dielectric layers 10, 20, 30, and 30 that are sequentially stacked. According to some embodiments, the first, second, third, and fourth dielectric layers 10, 20, 30, and 40 may be observed as a single dielectric layer. For example, boundaries between the dielectric layers 10, 20, 30 and 40 may not be clear.

The connection substrate 400 may have an opening 450 that exposes a top surface of the redistribution substrate RDS, and the first semiconductor chip 100 may be disposed in the opening 450 of the connection substrate 400. In a plan view, the first semiconductor chip 100 may be placed on a central portion of the redistribution substrate RDS.

The connection substrate 400 may include base layers 410 and conductive structures 420. The base layers 410 may include or be formed of a dielectric material. For example, the base layers 410 may include or be formed of a carbon-based material, a ceramic, or a polymer. The conductive structure 420 may include wiring patterns and a wiring via that electrically connects the wiring patterns to each other. The conductive structures 420 of the connection substrate 400 may be electrically connected to the first, second, and third redistribution patterns RDL1, RDL2, and RDL3 of the redistribution substrate RDS. The conductive structure 420 may include or be formed of metal. The conductive structure 420 may include or be formed of, for example, at least one selected from copper, aluminum, gold, lead, stainless steels, silver, iron, and any alloy thereof.

The lower molding layer 370 may be provided on the first semiconductor chip 100 and the connection substrate 400. The lower molding layer 370 may extend into a gap between the first semiconductor chip 100 and the connection substrate 400, thereby filling the gap. The lower molding layer 370 may include or be formed of a dielectric polymer, such as an epoxy-based polymer. The lower molding layer 370 may include on its upper portion one or more openings OP that expose portions of the conductive structures 420.

The second semiconductor package PK2 may include a package substrate 710, a second semiconductor chip 200, and an upper molding layer 730. The package substrate 710 may be a printed circuit board. Alternatively, a redistribution substrate may be used as the package substrate 710. The package substrate 710 may be provided with lower conductive pads 705 on a bottom surface thereof.

The second semiconductor chip 200 may be disposed on the package substrate 710. The second semiconductor chip 200 may include integrated circuits, and the integrated circuits may include a memory circuit, a logic circuit, or a combination thereof. The second semiconductor chip 200 may be of a different type from the first semiconductor chip 100. For example, the first semiconductor chip 100 may be a logic chip, and the second semiconductor chip 200 may be a memory chip. The second semiconductor chip 200 may have chip pads 221 electrically wire-bonded to upper conductive pads 715 on a top surface of the package substrate 710. The chip pads 221 of the second semiconductor chip 200 may be electrically connected to the lower conductive pads 705 through the upper conductive pads 715 and through internal lines in the package substrate 710. The package substrate 710 may be provided thereon with the upper molding layer 730 that covers the second semiconductor chip 200. The upper molding layer 730 may include or be formed of a dielectric polymer, such as an epoxy-based polymer.

Connection terminals 750 may be provided in the openings OP of the lower molding layer 370. The connection terminals 750 may be in contact with the conductive structures 420 and the lower conductive pads 705.

Figure 13:
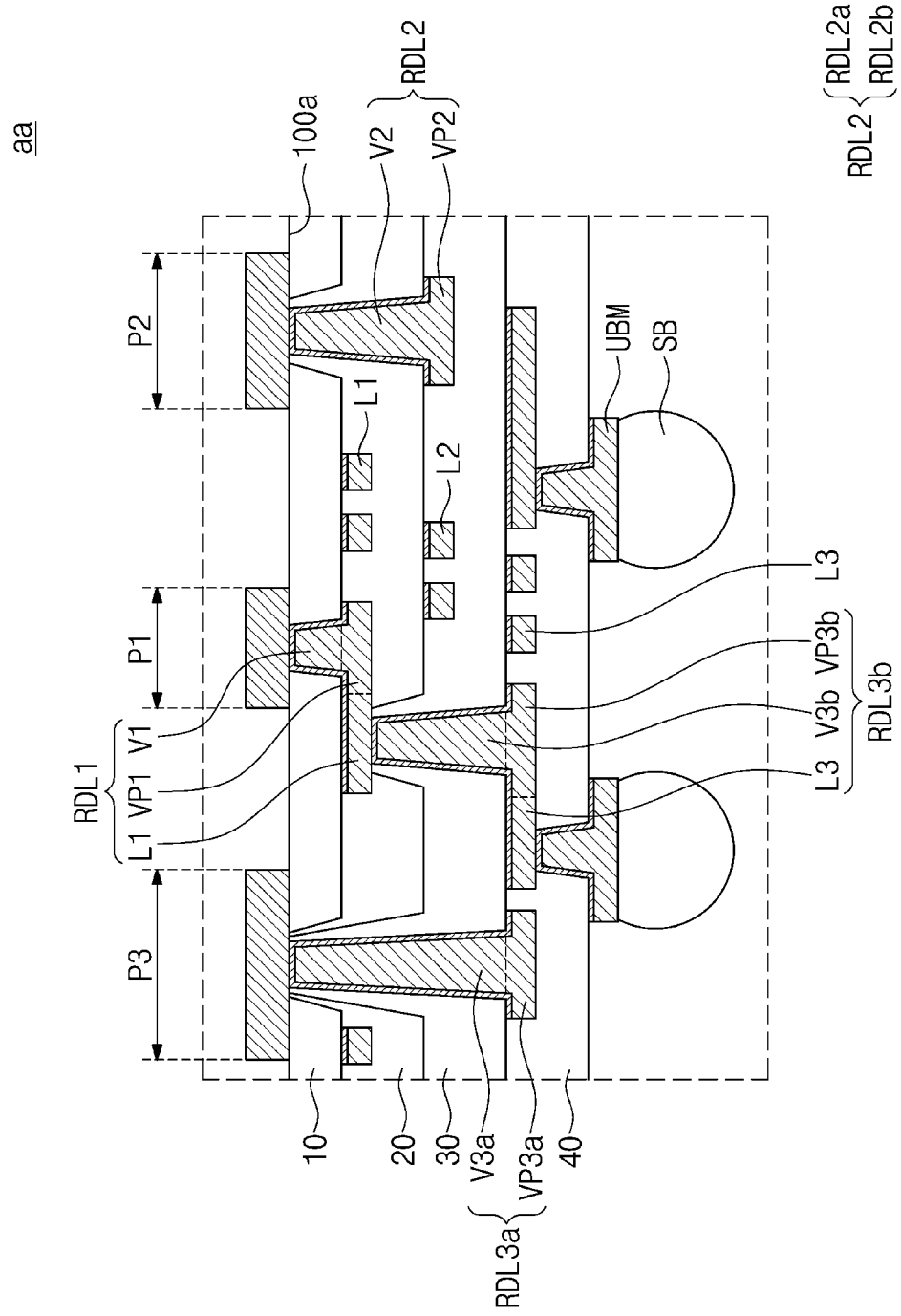
FIG. 13 illustrates an enlarged view showing section aa of FIG. 12.

FIG. 13 illustrates an enlarged view showing section aa of FIG. 12. The first semiconductor chip 100 may include the first chip pad CP1, the second chip pad CP2, and the third chip pad CP3. The third width/diameter P3 of the third chip pad CP3 may be greater than the second width/diameter P2 or the second chip pad CP2, and the second width/diameter P2 of the second chip pad CP2 may be greater than the first width/diameter P1 of the first chip pad CP1. The first chip pad CP1 may be in contact with the first via part V1 of the first redistribution pattern RDL1. The second chip pad CP2 may be in contact with the second via part V2 of the second redistribution pattern RDL2. The via part V3a of the third sub-redistribution pattern RDL3a may be in contact with the third chip pad CP3. The via part V3b of the fourth sub-redistribution pattern RDL3b may be in contact with the first line part L1 of the first redistribution pattern RDL1. A deep via may be included in each of the redistribution patterns RDL2, RDL3a, and RDL3b that are disposed farther than the first redistribution pattern RDL1 away from the active surface 100a. For example, the deep via may be a via extending longer than a thickness of a dielectric layer 10, 20, 30 or 40 of the redistribution substrate RDS.

Figure 14:
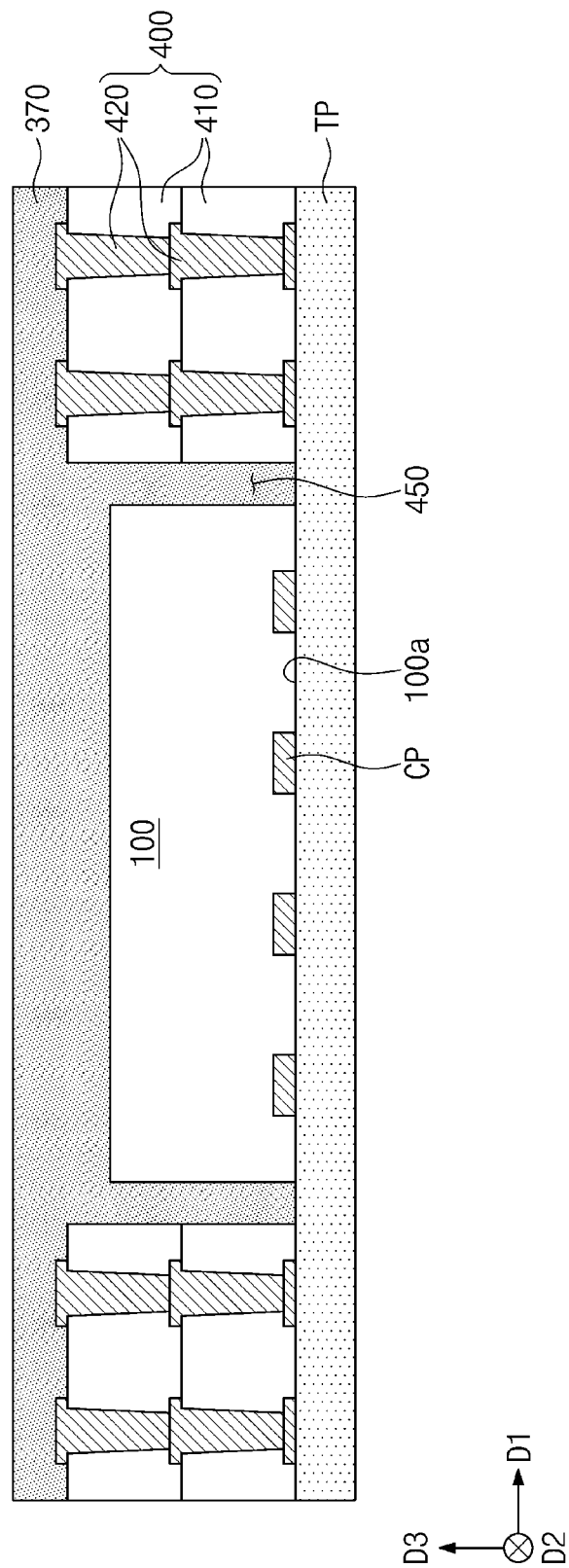
FIGS. 14 to 16 illustrate cross-sectional views showing a method of fabricating a semiconductor package device according to some embodiments of the present inventive concepts.
Figure 15:
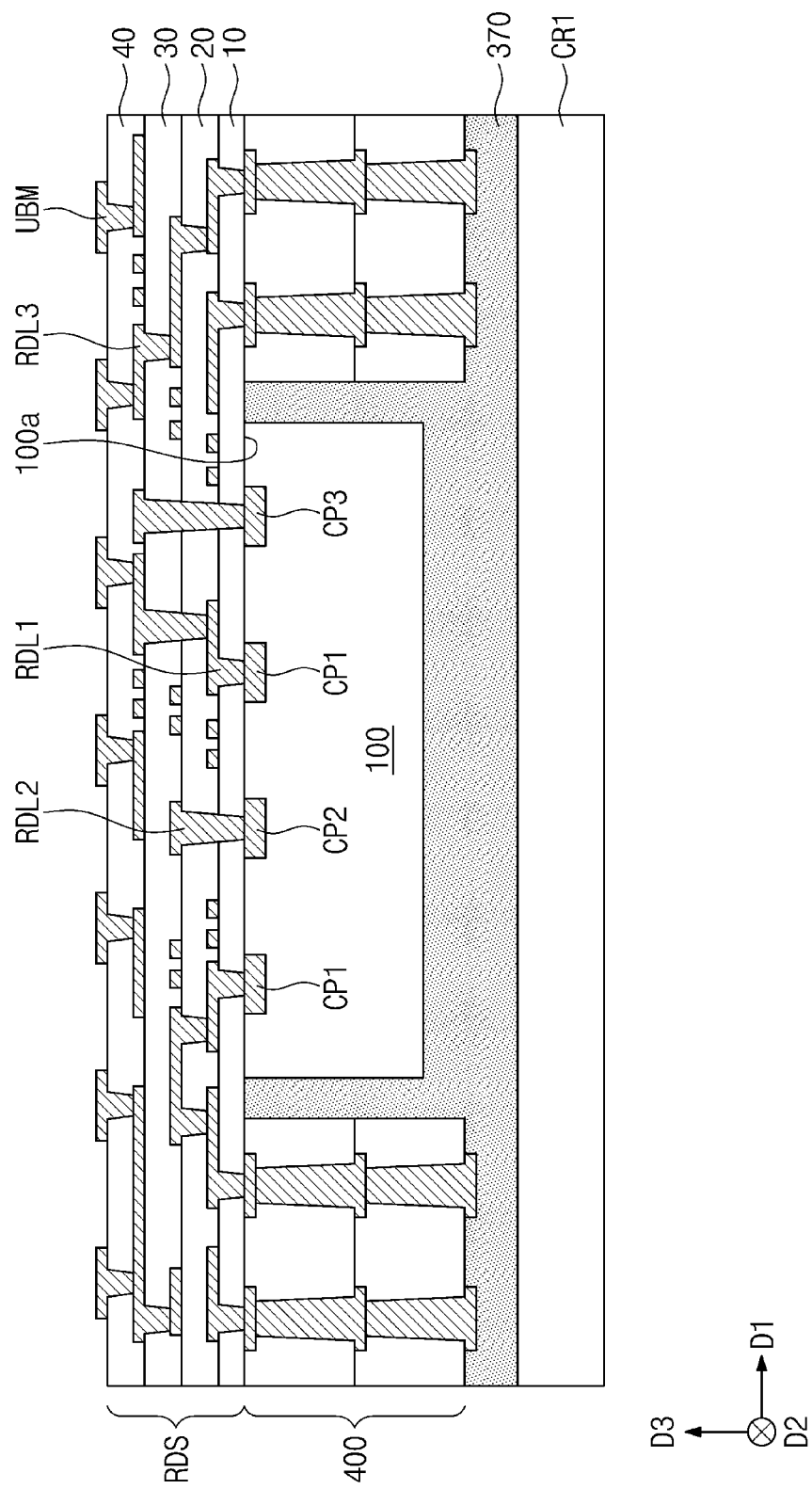
Figure 16:
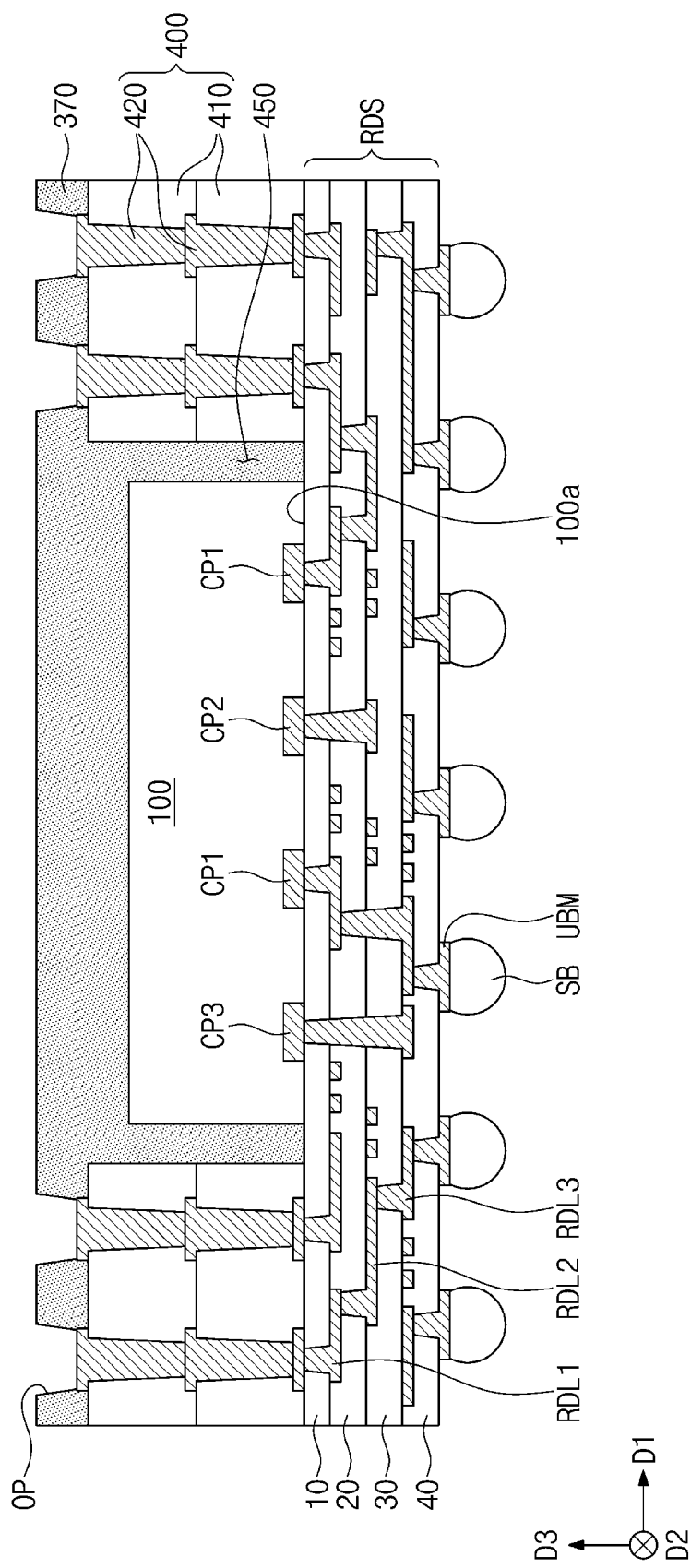

FIGS. 14 to 16 illustrate cross-sectional views showing a method of fabricating a semiconductor package device according to some embodiments of the present inventive concepts.

Referring to FIG. 14, an adhesive tape TP may be provided. A connection substrate 400 and a first semiconductor chip 100 may be attached onto the adhesive tape TP. The attachment of the connection substrate 400 may be followed or preceded by the attachment of the first semiconductor chip 100. For example, the connection substrate 400 may be manufactured by forming a hole in a printed circuit board.

Afterwards, a lower molding layer 370 may be formed to cover the connection substrate 400 and the first semiconductor chip 100. The lower molding layer 370 may be provided on the first semiconductor chip 100 and the connection substrate 400. The lower molding layer 370 may extend into a gap between the first semiconductor chip 100 and the connection substrate 400, thereby filling the gap.

Referring to FIG. 15, the connection substrate 400 may be turned over, e.g., by 180°, such that an active surface 400a of the first semiconductor chip 100 faces upwards. The adhesive tape TP may be removed to expose the active surface 100a of the first semiconductor chip 100.

A redistribution substrate RDS may be formed on the active surface 100a of the first semiconductor chip 100. The redistribution substrate RDS may be formed by the method discussed above with respect to FIGS. 1 to 8.

Referring to FIG. 16, the connection substrate 400 may be turned over again, e.g., by 180°, such that the active surface 100a of the first semiconductor chip 100 faces downwards. The redistribution substrate RDS may lie on a second carrier substrate. Thereafter, the lower molding layer 370 may undergo a laser process or the like to form an opening OP that exposes a portion of the conductive structure 420. After that, the second carrier substrate may be removed to form an external connection terminal SB on the under-bump pattern UBM.

Referring back to FIG. 12, a second semiconductor package PK2 may be provided on a first semiconductor package PK1, and a connection terminal 750 may be electrically connected to the conductive structure 420, thereby a semiconductor package device 1000 may be fabricated.

Figure 17:
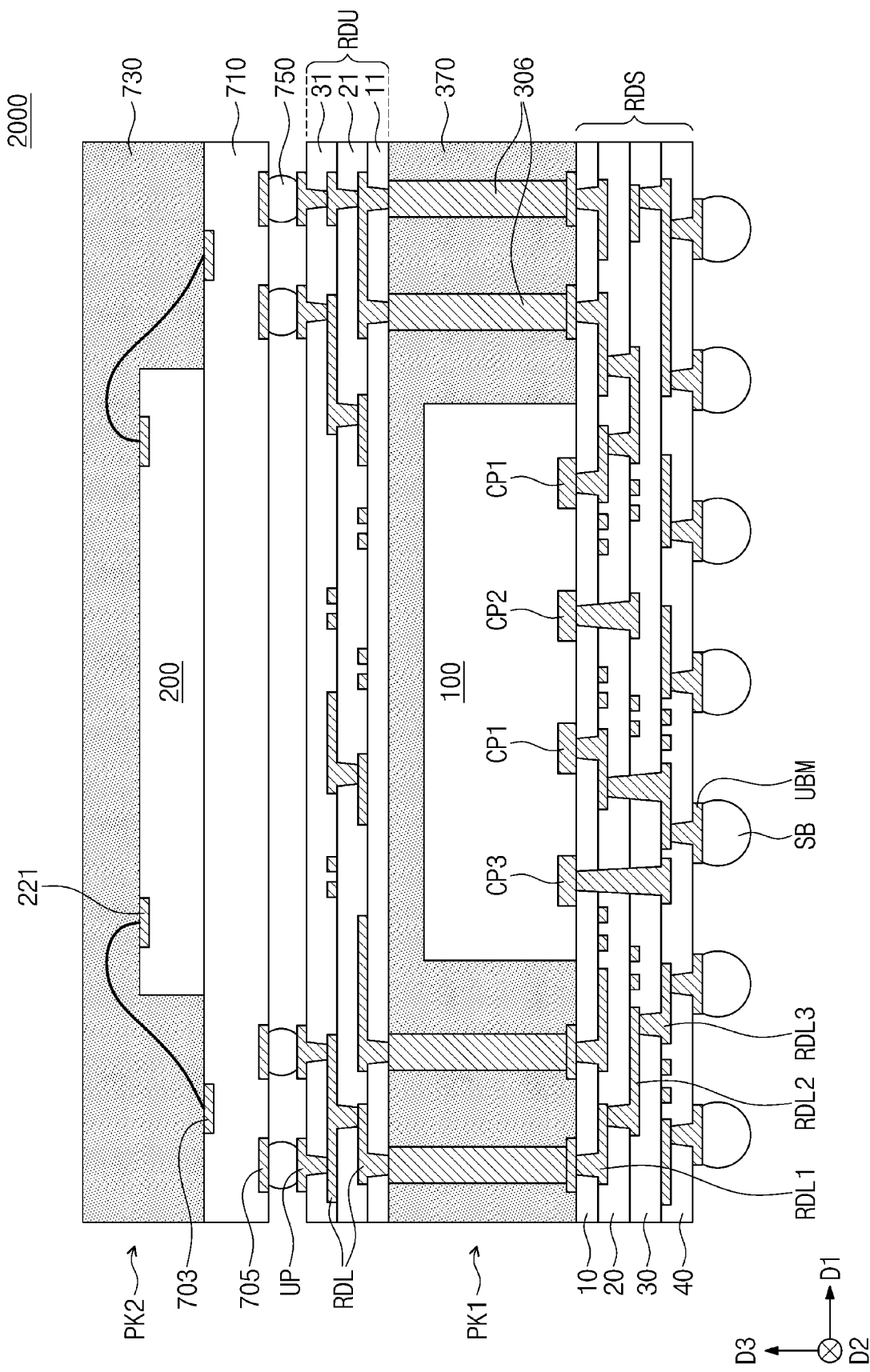
FIG. 17 illustrates a cross-sectional view showing a semiconductor package device according to some embodiments of the present inventive concepts.

FIG. 17 illustrates a cross-sectional view showing a semiconductor package device according to some embodiments of the present inventive concepts. Referring to FIG. 17, a semiconductor package device 2000 according to some embodiments may include a first semiconductor package PK1 and a second semiconductor package PK2 disposed on the first semiconductor package PK1.

The first semiconductor package PK1 may include a lower redistribution substrate RDS, an upper redistribution substrate RDU, a first semiconductor chip 100, metal pillars 306, and a lower molding layer 370. The lower redistribution substrate RDS and the first semiconductor chip 100 may be respectively substantially the same as the redistribution substrate RDS and the semiconductor chip 100 that are discussed in FIGS. 8 to 11. For example, the lower redistribution substrate RDS and the first semiconductor chip 100 may be respectively the same as the redistribution substrate RDS and the semiconductor chip 100 that are discussed in FIGS. 8 to 11.

The metal pillars 306 may be disposed around the first semiconductor chip 100, and may electrically connect the lower redistribution substrate RDS to the upper redistribution substrate RDU. The metal pillars 306 may penetrate the lower molding layer 370 and may have their top surfaces coplanar with that of the lower molding layer 370.

The lower molding layer 370 may be provided between the lower and upper redistribution substrates RDS and RDU, thereby covering the first semiconductor chip 100. The lower molding layer 370 may be provided on a top surface of the lower redistribution substrate RDS, and may cover a sidewall and a top surface of the first semiconductor chip 100. The lower molding layer 370 may fill gaps between the metal pillars 306, and may have a thickness substantially the same as a length of each of the metal pillars 306.

The upper redistribution substrate RDU may include an upper redistribution pattern RDL and fifth, sixth, and seventh dielectric layers 11, 21, and 31. The seventh dielectric layer 31 may be provided thereon with an upper bonding pad UP electrically connected to the upper redistribution pattern RDL. The second semiconductor package PK2 may be placed on the upper redistribution substrate RDU.

A semiconductor package device according to the present inventive concepts may include a semiconductor chip and a redistribution substrate which is provided on an active surface of the semiconductor chip. The redistribution substrate may include a first redistribution pattern and a second redistribution pattern that are sequentially stacked on the active surface. The second redistribution pattern may include a deep via part, and the deep via part may be in contact with a chip pad positioned on the active surface without being in contact with a via pad part of the first redistribution pattern. For example, the first redistribution pattern may have no via pad part directly connected to the second redistribution pattern. Thus, an area may be reduced as much as that of a via pad part whose area is relatively larger than an area of a line part, and accordingly a contact area may be deceased between the first redistribution pattern and its surrounding dielectric material. As a result, it may be beneficial to achieve a semiconductor package with improved reliability.

Although the present inventive concepts have been described in connection with the some embodiments of the present inventive concepts illustrated in the accompanying drawings, it will be understood by one of ordinary skill in the art that variations in form and detail may be made therein without departing from the spirit and essential feature of the present inventive concepts. The above disclosed embodiments should thus be considered illustrative and not restrictive.

What is claimed is:

1. A semiconductor package device, comprising:
a semiconductor chip that includes a first chip pad and a second chip pad spaced apart from the first chip pad, the first chip pad and the second chip pad being on an active surface of the semiconductor chip; and
a redistribution substrate on the first chip pad and the second chip pad,
wherein the redistribution substrate includes a first redistribution pattern and a second redistribution pattern that are sequentially stacked on the active surface,
wherein the first redistribution pattern includes:
a first via part; and
a first via pad part that vertically overlaps the first via part,
wherein the second redistribution pattern includes:
a second via part; and
a second via pad part that vertically overlaps the second via part,
wherein the first via part is in direct contact with the first chip pad,
wherein the second via part is in direct contact with the second chip pad, and
wherein a length of the second via part is greater than a length of the first via part.

2. The semiconductor package device of claim 1, wherein the first chip pad has a first diameter along a first direction parallel to the active surface,
the second chip pad has a second diameter along the first direction, and
the second diameter is greater than the first diameter.

3. The semiconductor package device of claim 2, wherein the second diameter is about 5 μm to about 60 μm greater than the first diameter.

4. The semiconductor package device of claim 1, wherein the semiconductor chip further includes:
a third chip pad on the active surface; and
a third redistribution pattern on the second redistribution pattern,
wherein the third redistribution pattern includes a third via part in direct contact with the third chip pad.

5. The semiconductor package device of claim 1, further comprising a third redistribution pattern on the second redistribution pattern,
wherein the third redistribution pattern includes a fourth via part in direct contact with the first redistribution pattern.

6. The semiconductor package device of claim 1, wherein the first via pad part and the second via part are not in direct contact with each other.

7. The semiconductor package device of claim 1, further comprising:
a connection substrate on the redistribution substrate; and
a molding layer that covers the connection substrate and the semiconductor chip,
wherein the connection substrate includes an opening on in a central portion of the connection substrate, and
wherein the semiconductor chip is in the opening.

8. The semiconductor package device of claim 1, further comprising:
a molding layer that covers the redistribution substrate and the semiconductor chip;
a metal pillar that penetrates the molding layer; and
an upper redistribution substrate on the molding layer and electrically connected to the metal pillar,
wherein the upper redistribution substrate includes a plurality of upper redistribution patterns that are vertically stacked.

9. The semiconductor package device of claim 1, wherein the redistribution substrate includes a first dielectric layer, the first redistribution pattern, a second dielectric layer, and the second redistribution pattern that are sequentially stacked on the active surface, and
wherein the second via part extends through the first dielectric layer and the second dielectric layer.

10. A semiconductor package device, comprising:
a semiconductor chip that includes a first chip pad and a second chip pad spaced apart from the first chip pad, the first chip pad and the second chip pad being on an active surface of the semiconductor chip; and
a redistribution substrate on the first chip pad and the second chip pad,
wherein the redistribution substrate includes a first dielectric layer, a first redistribution pattern, a second dielectric layer, and a second redistribution pattern that are sequentially stacked on the active surface,
wherein the first redistribution pattern is in direct contact with the first chip pad, wherein the second redistribution pattern includes a first sub-redistribution pattern and a second sub-redistribution pattern, wherein the first sub-redistribution pattern includes a first via part in direct contact with the second chip pad, wherein the second sub-redistribution pattern includes a second via part in direct contact with the first redistribution pattern, and wherein a length of the first via part is greater than a length of the second via part.

11. The semiconductor package device of claim 10, wherein the first chip pad has a first diameter along a first direction parallel to the active surface, the second chip pad has a second diameter along the first direction, and the second diameter is about 1.1 times to about 1.9 times the first diameter.

12. The semiconductor package device of claim 10, wherein the first sub-redistribution pattern further includes:
a first via pad part that vertically overlaps the first via part; and
a first line part electrically connected to the first via pad part, wherein the second sub-redistribution pattern further includes:
a second via pad part that vertically overlaps the second via part; and
a second line part electrically connected to the second via pad part, wherein a bottom surface of the first line part is at a vertical level substantially the same as a vertical level of a bottom surface of the second line part.

13. The semiconductor package device of claim 10, wherein the first via part penetrates the first dielectric layer and the second dielectric layer.

14. The semiconductor package device of claim 10, wherein the semiconductor chip further includes a third chip pad on the active surface, the redistribution substrate further includes a third dielectric layer and a third redistribution pattern that are sequentially stacked on the second redistribution pattern, the third redistribution pattern includes a third via part in direct contact with the third chip pad, and a length of the third via part is greater than a length of the first via part.

15. The semiconductor package device of claim 14, wherein the third redistribution pattern further includes a fourth via part in direct contact with the first redistribution pattern.

16. The semiconductor package device of claim 14, wherein the first chip pad has a first diameter along a first direction parallel to the active surface, the second chip pad has a second diameter along the first direction, the third chip pad has a third diameter along the first direction, the third diameter is greater than the second diameter, and the second diameter is greater than the first diameter.

17. The semiconductor package device of claim 10, wherein the first dielectric layer and the second dielectric layer include at least one selected from photosensitive polyimide, polybenzoxazole, phenolic polymers, and benzocyclobutene polymers.

18. The semiconductor package device of claim 10, wherein
each of the first redistribution pattern and the second redistribution pattern includes a seed/barrier pattern and a metal pattern on the seed/barrier pattern,
the seed/barrier pattern includes copper/titanium, and
the metal pattern includes copper.

19. A semiconductor package device, comprising:
a first semiconductor package; and
a second semiconductor package on the first semiconductor package,
wherein the first semiconductor package includes:
a redistribution substrate having a first surface and a second surface that face opposite each other;
a semiconductor chip on the first surface of the redistribution substrate and including a plurality of chip pads that face toward the first surface of the redistribution substrate, the chip pads being on an active surface of the semiconductor chip; and
a plurality of external connection terminals on the second surface of the redistribution substrate,
wherein the redistribution substrate includes a first redistribution pattern, a second redistribution pattern, and an under-bump pattern that are sequentially stacked on the active surface,
wherein the first redistribution pattern includes a first via part and a first via pad part that vertically overlaps the first via part,
wherein the second redistribution pattern includes a second via part and a second via pad part that vertically overlaps the second via part,
wherein the second via pad part is farther than the first via pad part away from the active surface,
wherein an uppermost portion of the second via part is closer to the active surface than an uppermost portion of the first via pad part,
wherein the chip pads include a first chip pad and a second chip pad spaced apart from the first chip pad,
the first via part is in direct contact with the first chip pad, and
the second via part is in direct contact with the second chip pad.

20. The semiconductor package device of claim 19, further comprising:
a third chip pad on the active surface of the semiconductor chip; and
a third redistribution pattern on the second redistribution pattern,
wherein the third redistribution pattern includes a third via part and a third via pad part that vertically overlaps the third via part,
wherein the third via pad part is downwardly farther away from the active surface than the second via pad part,
wherein a length of the third via part is greater than a length of the first via part, and
wherein the third via part is in direct contact with the third chip pad.

* * * * *